United States Patent [19]

Yata et al.

[11] Patent Number: 4,628,015
[45] Date of Patent: Dec. 9, 1986

[54] INSOLUBLE AND INFUSIBLE SUBSTRATE WITH A POLYACENE-TYPE SKELETAL STRUCTURE, AND ITS APPLICATIONS FOR ELECTRICAL CONDUCTOR AND ORGANIC CELL

[75] Inventors: Shizukuni Yata, Hyogo; Yukinori Hato, Osaka, both of Japan

[73] Assignee: Kanebo, Ltd., Tokyo, Japan

[21] Appl. No.: 777,889

[22] Filed: Sep. 19, 1985

[30] Foreign Application Priority Data

Sep. 20, 1984 [JP] Japan ................................. 59-197838
Sep. 27, 1984 [JP] Japan ................................. 59-203450
Sep. 27, 1984 [JP] Japan ................................. 59-203451

[51] Int. Cl.$^4$ ..................... H01M 4/60; H01M 10/40
[52] U.S. Cl. ................................. 429/194; 429/213
[58] Field of Search ................................. 429/213, 194

[56] References Cited

U.S. PATENT DOCUMENTS 4,375,427 3/1983 Miller et al. ........................ 429/213

Primary Examiner—Donald L. Walton
Attorney, Agent, or Firm—Flynn, Thiel, Boutell & Tanis

[57] ABSTRACT

An insoluble and infusible substrate with a polyacene-type skeletal structure having a hydrogen/carbon atomic ratio of from 0.05 to 0.60 and a specific surface area, measured by the BET method, of at least 600 m$^2$/g, said substrate being a heat-treated product of a mixture comprising an aromatic condensation polymer consisting of carbon, hydrogen and oxygen as a matrix and a fiber member selected from the group consisting of phenol resin fibers, heat-treated phenol resin fibers and carbon fibers dispersed therein.

The substrate has excellent physical properties such as strength and is useful as an electrode for organic cell.

37 Claims, 1 Drawing Figure

INSOLUBLE AND INFUSIBLE SUBSTRATE WITH A POLYACENE-TYPE SKELETAL STRUCTURE, AND ITS APPLICATIONS FOR ELECTRICAL CONDUCTOR AND ORGANIC CELL

BACKGROUND OF THE INVENTION

1. Field of the Invention

This invention relates to an insoluble and infusible substrate with a polyacene-type skeletal structure, an electrically conductive organic polymeric material obtained by doping the aforesaid substrate with a doping agent, and to an organic cell comprising the aforesaid material as an electrode and a solution in an aprotic organic solvent of a compound capable of forming dopant ions as an electrolytic solution.

2. Description of the Prior Art

Polymeric materials have excellent moldability, light weight and mass-producibility. It has been desired therefore in the electronics industry and many other industrial fields to produce electrically semiconductive or conductive organic polymeric materials by utilizing these excellent properties. It is especially desired to produce organic polymeric semiconductors or conductors which have an electrical conductivity in the range of semiconductors or conductors, possess the properties of n-type or p-type semiconductors as in inorganic semiconductors such as silicon and germanium, and can be applied to diodes, transistors, solar cells, etc. by utilizing their p-n junction.

Early organic polymeric semiconductors or conductors were limited in application because they were difficult to mold into films or sheets and did not have the properties of n-type or p-type extrinsic semiconductors. Recent advances in technology have resulted in the production of organic polymeric materials having the properties of n-type or p-type semiconductors, which have relatively good moldability and can be formed into molded articles, and of which electrical conductivity can be greatly increased by doping them with an electron donating dopant or an electron accepting dopant. Polyacetylene and polyphenylene are known as examples of such organic polymeric materials.

For example, "Gosei Kinzoku" Kagaku Zokan ("Synthetic Metals", Chemistry, special issue) No. 87, pages 15 to 28, 1980 discloses that by polymerizing acetylene, polyacetylene (having an electrical conductivity of $10^{-9}$ to $10^{-5}$ ohm$^{-1}$ cm$^{-1}$) in film form is directly obtained, and by doping it with an electron donating dopant or an electron accepting dopant, an n-type or p-type semiconductor having a greatly increased electrical conductivity can be obtained. Polyacetylene, however, has the defect of being susceptible to oxidation by oxygen. For example, when polyacetylene is left to stand in air, it gradually absorbs oxygen and increases in weight, and with it, turns black brown and finally pale yellow. The rapidity of this oxidation reaction depends upon the crystallinity of polyacetylene. For example, even powdery polyacetylene having a relatively good crystallinity prepared with a Ti(O-n-$C_4H_9$)$_4$-Al($C_2H_5$)$_3$ catalyst system changes in composition to $(CHO_{0.18})_x$ and drastically decreases in electrical conductivity when it is left to stand in air at room temperature for 2,000 hours. Thus, despite its excellent electrical conductivity, polyacetylene has poor oxidation stability and finds little practical application.

Japanese Laid-Open Patent Publication No. 129443/1980 discloses that an n-type or p-type semiconductor having a greatly increased electrically conductivity can be produced by press-forming polyphenylene (an insulator having an electrical conductivity of about $10^{-12}$ ohm$^{-1}$cm$^{-1}$) obtained by oxidative cationic polymerization of benzene, and doping the resulting molded articles of polyphenylene with an electron donating dopant or an electron accepting dopant. Unlike polyacetylene, polyphenylene has the advantage of possessing relatively good oxidation stability. Since, however, phenylene moieties are linked linearly by single bonds in polyphenylene, a conjugated system between carbon atoms is underdeveloped and there seems to be a limit in the level of its electrical conductivity which can be achieved by using a doping agent. Also, there seems to be a limit to the controllability of electrical properties by a doping agent. In fact, when polyphenylene is doped, for example, with halogen (an electron accepting dopant), the degree of its increase in electrical conductivity is smaller than that of polyacetylene doped with the same amount of halogen. Even when polyphenylene is doped with halogen in the largest dopable amount, its electrical conductivity does not increase beyond $10^{-7}$ ohm$^{-1}$ cm$^{-1}$ (see Example 5 of the above-cited Japanese patent document).

U.S. Pat. No. 4,375,427 discloses an electrically conductive organic polymeric composition comprising a polymer whose main chain is composed subsantially of (1) arylene units and (2) one or more chalcogen atoms or groups of such atoms interspersed between arylene units therein and at least one electron acceptor or donor dopant. The U.S. patent specification describes that this composition has a conductivity of at least $10^{-7}$ ohm$^{-1}$cm$^{-1}$.

In recent years, electronic devices and appliances have strikingly been reduced in size, thickness or weight, and with it, it has been increasingly desired to build electric cells in small size and thickness and light weight. Presently, silver oxide cells are in widespread use as small-sized electric cells of good performance. Thin dry cells or small-sized light-weight lithium cells of high performance have been developed and come into commercial acceptance. Since, however, they are primary cells, they cannot be used for long periods of time by repeated charging and discharging. On the other hand, nickel-cadmium cells have been used as secondary cells of high performance, but are still unsatisfactory in realizing small size, small thickness and light weight.

Lead storage cells have been used in various industrial fields as secondary cells of a large capacity. The greatest defect of these storage cells is their large weight. This is inevitable, however, since lead peroxide and lead are used as electrodes. In recent years, attempts have been made to decrease their sizes and improve their performance for use in electric automobiles, but have not resulted in practical cells. There has been a strong demand, however, for light-weight secondary cells of a large capacity as storage cells.

The cells now in commercial acceptance have their own advantages and disadvantages and are used selectively according to the desired uses.

To fill the present-day need for smaller sizes, smaller thicknesses and lighter weights, a cell has recently been developed which contains an electrode active substance obtained by doping a thin film of polyacetylene, an organic semiconductor, with an electron donating or accepting substance (see the specification of Japanese Laid-Open Patent Publication No. 136469/1981 corresponding to U.S. Pat. Nos. 4,321,114 and 4,442,187 and European Laid-Open Patent Publications Nos. 36118 and 124702). This cell is a secondary cell of high performance and could be rendered thinner and lighter. But it has the defect that the polyacetylene as an organic semiconductor is very unstable, and readily undergoes oxidation by oxygen in the air or degeneration by heat. This cell should therefore be produced in an atmosphere of an inert gas, and there is also a restriction in the molding of polyacetylene into a shape suitable as an electrode.

U.S. Pat. No. 4,472,489 discloses a polymeric electrode comprising a conjugated backbone polymer as electroactive material and a surface coating which is the product of reaction between a reduced conjugated backbone polymer and an organic compound such as sultones or sulfonates. The U.S. patent specification describes that the surface coating improves the stability of the electrode when the polymer is highly reduced during battery use.

The co-pending U.S. patent application Ser. No. 690,799 and European Patent Application No. 85100517.3 of the present applicants disclose a novel insoluble and infusible substrate with a polyacen-type skeletal structure which has a high surface area and exhibits excellent oxidation stability as well as excellent physical properties, an electrically conductive organic polymeric material composed of this substrate and a doping agent, and an organic cell comprising a positive electrode, a negative electrode and an electrolytic solution, at least one of the electrodes being composed of the above substrate and the above electrolytic solution being a solution in an aprotic organic solvent of a compound capable of forming ions which can dope the electrode by electrolysis. This secondary cell has a high electromotive voltage, a high charge efficiency and energy efficiency in charging and discharging, a high energy density and power density per unit weight, and a long service life and is maintenance-free and low in cost, but is still desired to be improved.

SUMMARY OF THE INVENTION

It is an object of this invention to provide a novel insoluble and infusible substrate with a polyacene-type skeletal structure which has a high surface area and excellent physical properties such as strength.

Another object of this invention is to provide an insoluble and infusible substrate with a polyacene-type skeletal structure which does not develop cracks, or develops cracks only to a slight extent that does not give rise to a problem, during its production. Another object of this invention is to provide an insoluble and infusible substrate with a polyacene-type skeletal structure which can be easily produced as a large-sized molded article.

Another object of this invention is to provide an insoluble and infusible substrate of the aforesaid properties which can give an excellent electrically conductive organic polymeric material by doping with an electron donating or accepting doping agent.

Another object of this invention is to provide an insoluble and infusible substrate with a polyacene-type skeletal structure which has a high specific surface area and can be used suitably as an electrode of an organic electrolytic cell containing an electrolytic solution composed of a solution in an aprotic organic solvent of a compound capable of forming dopant ions by electrolysis.

Another object of this invention is to provide an insoluble and infusible substance of a high specific surface area which can be doped at a high doping speed and also with a doping agent having a large ionic radius.

Another object of this invention is to provide an electrically conductive organic polymeric material which exhibits excellent oxidation stability in addition to having the electrical conductivity of a semiconductor or conductor and excellent physical properties.

Another object of this invention is to provide an electrically conductive organic polymeric material comprising a substrate of an insoluble and infusible material having a polyacene-type skeletal structure with a developed conjugated system between carbon atoms and an electron donating dopant or an electron accepting dopant.

Another object of this invention is to provide an electrically conductive organic polymeric material having the properties of a p-type or n-type extrinsic semiconductor.

Another object of this invention is to provide a secondary cell of high performance comprising the aforesaid insoluble and infusible substrate with a polyacene-type skeletal structure as an electrode.

Another object of this invention is to provide a secondary cell having a high electromotive voltage, a high coulombic efficiency and energy efficiency in charging and discharging and a high energy density and power density per unit weight.

Another object of this invention is to provide a secondary cell which has a long service life and is maintenance-free.

Another object of this invention is to provide a secondary cell which has high strength and a large size.

Another object of this invention is to provide a secondary cell which is easy to build in small size or thickness.

Another object of this invention is to provide a secondary cell which is easy to produce and low in cost.

Further objects and advantages of this invention will become apparent from the following description.

According to this invention, these objects and advantages are achieved firstly by an insoluble and infusible substrate with a polyacene-type skeletal structure having a hydrogen/carbon atomic ratio of from 0.05 to 0.60 and a specific surface area, measured by the BET method, of at least 600 m$^2$/g, said substrate being a heat-treated product of a mixture comprising an aromatic condensation polymer consisting of carbon, hydrogen and oxygen as a matrix and a fiber member selected from the group consisting of phenol resin fibers, heat-treated phenol resin fibers and carbon fibers dispersed therein.

According to this invention, the above objects and advantages are achieved secondly by an electrically conductive organic polymeric material comprising (a) an insoluble and infusible substrate with a polyacene-type skeletal structure having a hydrogen/carbon atomic ratio of from 0.05 to 0.60 and a specific surface area, measured by the BET method, of at least 600 m$^2$/g, said substrate being a heat-treated product of a mixture comprising an aromatic condensation polymer consisting of carbon, hydrogen and oxygen as a matrix and a fiber member selected from the group consisting of phenol resin fibers, heat-treated phenol resin fibers and carbon fibers dispersed therein, and (b) an electron donating doping agent, or an electron accepting doping agent, or both; said material having a higher electrical conductivity than the non-doped substrate (a).

According to this invention, the above objects and advantages are achieved thirdly by an organic cell comprising a positive electrode, a negative electrode and an electrolytic solution, one or both of said positive and negative electrodes being composed of an insoluble and infusible substrate with a polyacene-type skeletal structure having a hydrogen/carbon atomic ratio of from 0.05 to 0.60 and a specific surface area, measured by the BET method, of at least 600 m$^2$/g, said substrate being a heat-treated product of a mixture comprising an aromatic condensation polymer consisting of carbon hydrogen and oxygen as a matrix and a fiber member selected from the group consisting of phenol resin fibers, heat-treated phenol resin fibers and carbon fibers dispersed therein, and said electrolytic solution being a solution in an aprotic organic solvent of a compound capable of forming ions which can dope said electrodes by electrolysis.

BRIEF DESCRIPTION OF THE ACCOMPANYING DRAWING

FIG. 1 is a view for roughly illustrating the structure of the cell of this invention.

DETAILED DESCRIPTION OF THE INVENTION

Figure 1:
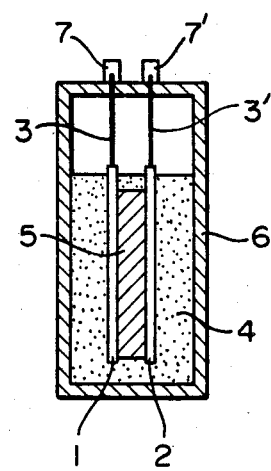

The insoluble and infusible substrate, electrically conductive organic polymeric material and organic cell in accordance with this invention will be described in detail below.

The insoluble and infusible substrate of this invention can be produced, for example, by the following method from an aromatic condensation polymer consisting of carbon, hydrogen and oxygen and a fiber member selected from the group consisting of phenol resin fibers, heat-treated phenol resin fibers and carbon fibers.

First, the aromatic condensation polymer, the fiber member and zinc chloride are mixed. Any method of mixing such as dry mixing or wet mixing may be employed which can permit uniform mixing of the three ingredients. To perform uniform mixing sufficiently, it is desirable to add a suitable solvent such as water, methanol and acetone to the aromatic condensation polymer and zinc chloride to form a solution, and then mix the fiber member with the solution. When the fiber member is in the form of a cloth or felt, it may be impregnated with a solution of the aromatic condensation polymer and zinc chloride to form a prepreg.

The method of molding may be the same as that employed generally in producing a resin molded article. For example, when it is desired to obtain a film-like article, a slurry of the three ingredients mentioned above may be formed into a film of a suitable thickness by an applicator. A plate-like article may be obtained by press-forming the mixture in a mold, as is generally well known. Furthermore, if the aforesaid prepreg is placed between flat plates such as metal plates and compressed, a plate of a suitable thickness can be obtained. Thus, a molded article of a mixture of the aromatic condensation polymer as a matrix and the fiber member dispersed therein can be obtained.

The fiber member is used in a proportion of usually about 5 to 75% by weight, preferably about 10 to 60% by weight, more preferably about 20 to 50% by weight, based on the total weight of the aromatic condensation polymer and the fiber member. The proportion of zinc chloride used is usually 50 to 700% by weight, preferably 100 to 500% by weight, more preferably 150 to 400% by weight, based on the total weight of the aromatic condensation polymer and the fiber member. The use of zinc chloride greatly increases the specific surface area of the insoluble and infusible substrate of this invention as compared with the case of not using it. Accordingly, when the substrate of this invention is used as an electrode of a cell, ions in an electrolyte can be smoothly doped or undoped.

The molded article may be cured by heating it at a temperature of 50° to 180° C. for 2 to 60 minutes, or heating it at 50° to 150° C. in the presence of a curing agent and a catalyst for 2 to 90 minutes. The resulting cured article is in the form of a film, a plate, etc. and has high mechanical strength. It may be processed into a circular shape, a rectangular shape, etc. or cut to a suitable size.

The cured molded article is thereafter heated in a non-oxidizing atmosphere at 350° to 800° C., preferably 420° to 800° C.

The heat-treatment conditions differ somewhat depending upon the type of the aromatic condensation polymer, the degree of the curing treatment or the shape of the polymeric article. Generally, the temperature can be raised from room temperature to about 300° C. at a relatively high rate, for example at 100° C./hour. When the temperature exceeds 300° C., the aromatic condensation polymer, and the fiber member as well when it is the phenol resin fibers or heat-treated phenol resin fibers, begin to decompose thermally to evolve gases such as water vapor (H$_2$), hydrogen, methane and carbon monoxide. Therefore, up to more than 300° C., it is advantageous to raise the temperature at a sufficiently slow rate.

The resulting heat-treated product is fully washed with hot water at 50° to 100° C. to remove the inorganic material such as zinc chloride or sodium phosphate used in the starting mixture, and dried.

As a result, an insoluble and infusible substrate is formed which has a hydrogen/carbon atomic ratio of from 0.05 to 0.6 and a specific surface area, measured by the BET method, of at least 600 m$^2$/g. This substrate has a polyacene-type skeletal structure, and is of a structure permitting incoming and outgoing of electrolyte ions smoothly by an electrochemical method as will be shown hereinbelow. In the X-ray diffraction (CuK$\alpha$ radiation) of the substrate, the main peak is observed at $2\theta = 22°$ or less in all regions where the hydrogen/carbon atomic ratio is from 0.05 to 0.6. This fact shows that the planar polyacene-type molecules constituting the substrate of this invention have a very broad average interplanar spacing. This is presumably the reason why it has a specific surface area, by the BET method, of as high as at least 600 m$^2$/g.

Suitable aromatic condensation polymers consisting of carbon, hydrogen and oxygen are condensation product formed between aromatic hydrocarbon compounds having a phenolic hydroxyl group and aldehydes.

Phenols such as phenol, cresol and xylenol are suitable as the aromatic compounds, but these are not limitative examples. There can also be used methylenebisphenols of the following formula

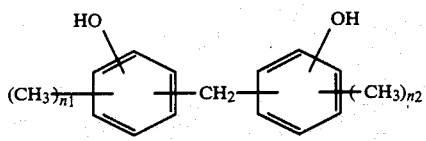

wherein $n_1$ and $n_2$ may be the same or different, and are integers of 0 to 2, hydroxy-biphenyls and hydroxynaphthalenes. For practical purposes, phenols, especially phenol, are preferred.

Examples of the aldehydes are formaldehyde, acetaldehyde and furfural. Formaldehyde is preferred.

The phenol-formaldehyde condensate may be a novolak, a resol or a mixture of these.

According to this invention, a modified aromatic condensation polymer obtained by using an aromatic hydrocarbon free from a phenolic hydroxyl group, such as xylene or toluene, in place of a part of the aromatic hydrocarbon having a phenolic hydroxyl group, can also be used as the aromatic condensation polymer consisting of carbon, hydrogen and oxygen. There can also be used an aromatic condensation polymer corresponding to a condensate of an aromatic compound containing an oxygen atom as a hetero atom and an aldehyde, such as a condensate of furfuryl alcohol corresponding to a condensate of furan and formaldehyde.

Advantageously, the aromatic condensation polymer consisting of carbon, hydrogen and oxygen is heat-treated after it is molded into a film or a plate.

The aromatic condensation polymers as such have a hydrogen/carbon atomic ratio of usually at least 0.9 and scarcely below 0.8.

Phenol resin fibers, heat-treated phenol resin fibers or carbon fibers are used as the fiber member.

The phenol resin from which the phenol resin fibers or heat-treated phenol resin fibers are made is usually the aforesaid condensate of phenol and formaldehyde. For example, the phenol resin fibers may be obtained by melt-spinning a novolak-type phenol resin, and treating the fibers with a curing agent such as formaldehyde in the presence of an acid or basic catalyst.

The heat-treated phenol resin fibers may be obtained by heat-treating such phenol resin fibers at a temperature of at least 150° C., particularly in the range of 150° to 800° C. The heat-treatment may be carried out in an oxidizing atmosphere or a non-oxidizing atmosphere, but preferably in a non-oxidizing atmosphere. The heat-treatment is carried out usually for 10 minutes to 10 hours. When the heat-treated phenol resin fibers are used, crack formation is very little in the aforesaid heat-treatment step in the production of the insoluble and infusible substrate of this invention.

The carbon fibers may be carbon fibers of the acrylic, pitch or phenol resin type.

These fiber members used in this invention may be in the form of short fibers, long fibers, or a fibrous structure such as a non-twisted strand, a twisted cord or a felt.

The insoluble and infusible substrate of this invention having hydrogen/carbon atomic ratio (to be sometimes referred to as H/C) is especially suitable for production of electrically conductive organic polymeric materials when its H/C is 0.15 to 0.60, preferably 0.25 to 0.5, and particularly for use in organic cells when its H/C is 0.05 to 0.5, preferably 0.1 to 0.35.

The electrical conductivity of the insoluble and infusible substrate of this invention differs depending upon the H/C atomic ratio. For example, when its H/C is 0.6, it has an electrical conductivity of not more than $10^{-11}$ ohm$^{-1}$cm$^{-1}$. When its H/C is 0.15, it is a semiconductor having an electrical conductivity of about $10^{-2}$ ohm$^{-1}$cm$^{-1}$. When the above substrate is doped with an electron donating or accepting dopant, its electrical conductivity increases greatly to provide an n-type or p-type semiconductor.

Since the insoluble and infusible substrate of this invention having a polyacene-type skeletal structure has a specific surface area, measured by the BET method, of as high as 600 m$^2$/g, it is anticipated that gases such as oxygen will readily enter and degrade it. In fact, contrary to the anticipation, the substrate of this invention remains substantially unchanged in properties, etc. even when left to stand in the air for a long period of time. For example, when it is left to stand in the air for 1000 hours, no change occurs in electrical conductivity and it still retains its excellent oxidation stability.

The electrically conductive organic polymeric material is produced by doping the insoluble and infusible substrate of this invention with an electron donating or accepting doping agent.

Doping agents which are generally known can be used as the electron donating or accepting doping agents.

Substances which readily liberate electrons are used as the electron donating dopants. Preferred examples are metals of Group IA of the periodic table such as lithium, sodium, potassium, rubidium and cesium.

Substances which readily accept electrons are used as the electron accepting dopants. Preferred examples are halogens such as fluorine, chlorine, bromine and iodine, halogen compounds such as AsF$_5$, PF$_5$, BF$_3$, BCl$_3$ and BBr$_3$, oxides of non-metallic elements such as SO$_3$ or N$_2$O$_5$, and inorganic acids such as H$_2$SO$_4$, HNO$_3$ and HClO$_4$.

Substantially the same method as the doping methods previously used for polyacetylene or polyphenylene can be used to dope the substrate of this invention with such dopants.

When the dopant is an alkali metal, the substrate can be doped by contacting it with a molten alkali metal or a vapor of the alkali metal. Or the insoluble and infusible substrate can be contacted with an alkali metal-naphthalene complex formed in tetrahydrofuran.

When the dopant is a halogen, a halogen compound or a non-metallic element oxide, the substrate can be easily doped by contacting it with a gas of such a dopant.

When the dopant is an anion derived from an inorganic acid, the substrate can be doped by coating or impregnating it directly with the inorganic acid, or by performing electrolysis in an electrolytic solution containing the inorganic acid using the substrate as an anode.

Generally, the doping agent is used such that it exists in the resulting organic polymeric material of this invention in a proportion of at least $10^{-5}$ mole per recurring unit of the aromatic condensation polymer.

Thus, the organic polymeric material of this invention has a higher electrical conductivity than the insoluble and infusible substrate before the doping, preferably 10 times or more as high as the latter. By suitable methods, the electrical conductivity of the resulting organic polymeric material of this invention is $10^3$ to $10^6$ times or more as high as that of the non-doped substrate.

When the H/C atomic ratio exceeds 0.60, the conjugated system of electrons is considered to be localized because the polyacene-type skeletal structure of the polymer has not yet grown. At such a ratio, the substrate does not increase in electrical conductivity even when doped with the dopant, and it does not become an n-type or p-type semiconductor. When the H/C atomic ratio is less than 0.15, the polyacene-type skeletal structure is grown fully, and the conjugated system of electrons is fully non-localized, and the substrate can be doped with the doping agent. However, since the substrate itself before doping has a considerably high electrical conductivity, the contribution of the doping to the electrical conductivity is little, and the electrical conductivity of the doped substrate is not so much higher than the non-doped substrate.

Since the insoluble and infusible substrate of this invention having a polyacene-type skeletal structure has a specific surface area, measured by the BET method, of as high as at least 600 m$^2$/g, the doping speed is large and a substrate having a large thickness can be doped within a short period of time. Furthermore, the substrate can be doped smoothly with a doping agent having a large ionic radius such as $ClO_4^-$ and $BF_4^-$. For example, let us assume that the substrate is electrolytically doped with $ClO_4^-$ ions in a propylene carbonate solution of metallic Li/ $LiClO_4$ (1 mole/liter/substrate). If the specific surface area of the substrate is not more than 600 m$^2$/g, the doping is difficult to perform while maintaining a potential of 4 V between the metallic lithium and the substrate. With the substrate of this invention having a specific surface area of at least 600 m$^2$/g, however, the $ClO_4^-$ ion can be fully introduced into the substrate at this potential.

The electrically conductive organic polymeric material doped with the electron donating dopant has the electrical conductivity of an n-type (electron excessive type) semiconductor or conductor. The electrically conductive organic polymeric material of this invention doped with the electron accepting dopant has the electrical conductivity of a p-type (hole excessive type) semiconductor or conductor.

According to this invention, the electron donating dopant and the electron accepting dopant may be used in combination as the dopant. When these doping agents are present together uniformly, the doped substrate becomes p-type or n-type by one of these doping agents which is present in a larger amount. For example, if the electron donating dopant is present in a larger amount, the substrate becomes n-type. If the electron accepting dopant is present in a larger amount, the substrate becomes p-type. The electrically conductive organic polymeric material having a mixture of the doping agents can be produced by contacting the insoluble and infusible substrate with a mixture of the dopants, or by contacting it with one of the doping agents, and then with the other.

An electrically conductive organic polymeric material having a so-called p-n junction is also within the scope of this invention. Such a material can be produced by doping the insoluble and infusible substrate with the electron donating dopant from one side and the electron accepting doping agent from the other; or by doping the entire surface of the substrate with one of the doping agents and then doping only a part of the doped surface with the other dopant.

The electrically conductive organic polymeric material obtained by this invention preferably has a dc conductivity at room temperature of at least $10^{-4}$ ohm$^{-1}$ cm$^{-1}$.

As is clear from the foregoing description, the electrically conductive organic polymeric material of this invention is given in the form of a molded article such as a film or a plate.

The organic cell of this invention comprises the insoluble and infusible substrate of this invention as at least one electrode and a solution in an aprotic organic solvent of a compound capable of forming ions which can dope the electrode by electrolysis.

Heat-treated products of condensation products of aromatic hydrocarbon compounds having a phenolic hydroxyl group and aldehydes, above all a heat-treated product of a condensation product of phenol and formaldehyde, are suitably used as the insoluble and infusible substrate.

The hydrogen/carbon atomic ratio of the insoluble and infusible substrate having a polyacene-type skeletal structure is from 0.05 to 0.6, preferably from 0.05 to 0.5, more preferably from 0.1 to 0.35. If the atomic ratio is less than 0.05, the coulombic efficiency of a secondary cell built by using the substrate in charging and discharging is not satisfactory, and the energy density is reduced. On the other hand, if the atomic ratio is more than 0.6, the coulombic efficiency during charging or discharging becomes poor.

The specific surface area, measured by the BET method, of the insoluble and infusible substrate is at least 600 m$^2$/g. If it is less than 600 m$^2$/g, it is necessary to increase the charging voltage at the time of charging a secondary cell produced by using the substrate as an electrode. Consequently, the energy efficiency is reduced, and the electrolytic solution will be degraded.

The shape of the insoluble and infusible substrate of this invention used as an electrode can be freely selected depending upon the performance, size, shape, etc. of the desired cell. For example, it is preferably in the form of a film, a sheet, a plate or a porous plate. The free selectability of the shape of the insoluble and infusible substrate as an electrode depending upon the purpose of use is one characteristic of this invention. Electrodes of various shapes cannot be obtained from conventional known electrically conductive organic polymeric materials such as polyacetylene or poly-p-phenylene.

Examples of the compound capable of forming ions which can dope the electrode include the halides, perchlorates, hexafluorophosphates, hexafluoroarsenates and tetrafluoroborates of alkali metals or tetraalkyl ammoniums. Specific examples are LiI, NaI, NH$_4$I, LiClO$_4$, LiAsF$_6$, LiBF$_4$, KPF$_6$, NaPF$_6$, (C$_2$H$_5$)$_4$NClO$_4$, (C$_2$H$_5$)$_4$NBF$_4$, (n-C$_4$H$_9$)$_4$NClO$_4$, (n-C$_4$H$_9$)$_4$NAsF$_6$, (n-C$_4$H$_9$)$_4$NPF$_6$ and LiHF$_2$.

Examples of the aprotic organic solvent for dissolving the aforesaid compounds include ethylene carbonate, propylene carbonate, gamma-butyrolactone, dimethyl formamide, dimethyl acetamide, dimethyl sulfoxide, sulfolane, acetonitrile, dimethoxyethane, tetrahydrofuran, methylene chloride and mixtures of these. The solvent is selected by considering the solubility of the compound used as an electrolyte, the performance of the cell, etc.

Among the above aprotic organic solvents, propylene carbonate, gamma-butyrolactone, sulfolane and dimethoxyethane are especially preferred because they prevent self-discharging of the organic cell produced.

The concentration of the aforesaid compound in the electrolytic solution is preferably at least 0.1 mole/liter in order to reduce the internal resistance by the electrolytic solution. Usually, it is more preferably from 0.2 to 1.5 moles/liter.

The cell of this invention comprises the insoluble and infusible substrate having a polyacene-type skeletal structure as a positive electrode and/or a negative electrode and an electrolytic solution composed of a solution of the dopant in the aprotic organic solvent. Its activity utilizes the electrochemical doping and electrochemical undoping of the substrate with dopants. In other words, the energy is stored or released outside by electrochemical doping of the substrate with the dopant, or released outside or stored inside as an electrical energy by electrochemical undoping.

The cell in accordance with this invention can be divided roughly into two types. A first type is a cell in which the insoluble and infusible substrate is used both as a positive and a negative electrode. A second type is a cell in which the insoluble and infusible substrate is used as a positive electrode and an electrode composed of an alkali metal or its alloy as a negative electrode.

The shape and size of the electrode composed of the insoluble and infusible substrate disposed within the cell may be properly selected depending upon the desired cell. But since the cell reaction is an electrochemical reaction on the surface of the electrode, the electrode advantageously has as high a surface area as possible.

The insoluble and infusible substrate, either doped or non-doped, may be used as a current collector for taking out an electric current from the substrate out of the cell. Other electrically conductive materials having corrosion resistance to the doping agents and the electrolytic solution, such as carbon, platinum, nickel and stainless steel, may also be used as the collector.

With reference to the accompanying drawing, one embodiment of the cell of this invention will be described below. In the drawing, the reference numeral 1 represents a positive electrode; 2, a negative electrode; 3 and 3', current collector; 4, an electrolytic solution; 5, a a separator; 6, a casing; and 7 and 7', an outside terminal.

The first type of the cell of this invention in which both the positive and negative electrodes are made of the insoluble and infusible substrate will first be described. The positive electrode 1 is made of the insoluble and infusible substrate having the shape of a film or plate, which may be doped or non-doped. The negative electrode 2 is the insoluble and infusible substrate having the shape of a film or plate, which may be doped or non-doped. After the cell is built, a voltage is applied to it from an external power supply to dope the substrate with the doping agent. For example, when both electrodes are made of the non-doped insoluble and infusible substrate, the electromotive voltage of the cell after building is 0 V. By applying a voltage to it from an external power supply and doping both electrodes with the doping agent, the cell gains an electromotive force. The current collectors 3 and 3' serve to take out a current outside from the electrodes or supply a current for electrochemical doping, namely for charging. They are connected respectively to the electrodes and the external terminals 7 and 7' in such a manner as not to cause a decrease in voltage. The electrolytic solution 4 is a solution in the aprotic organic solvent of the aforesaid compound capable of forming ions which can dope the electrodes. The electrolytic solution is usually liquid, but to prevent leakage, it may be used in the form of a gel or a solid. The separator 5 is disposed to prevent contact between the positive and negative electrodes and to hold the electrolytic solution. The separator 5 is preferably made of an open-cellular porous material which is electrically non-conductive and has durability to the electrolytic solution, the dopants, and electrode active substances such as alkali metals. It may be a cloth, non-woven cloth, a porous material, etc. composed of glass fibers, polyethylene, polypropylene, etc. To decrease the internal resistance of the cell, the separator is preferably as thin as possible. Its thickness, however, is determined by considering the amount of the electrolytic solution held, its permeability, strength, etc. The positive and negative electrodes and the are fixed in position within the casing 6 in a manner not to give rise to any problem in use. The shape, size, etc. of the electrode may be properly determined according to the shape and performance of the desired cell. For example, to produce a thin cell, the electrode is preferably in the form of a film. A cell of a large capacity may be produced by alternately stacking a plurality of positive and negative electrodes in the form of a film or plate.

Now, the second-type cell in accordance with this invention in which the positive electrode 1 is made of the insoluble and infusible substrate and the negative electrode 2 is made of an alkali metal or its alloy will be described.

Examples of the alkali metal are cesium, rubidium, potassium, sodium and lithium. Lithium is most preferred.

In FIG. 1, the positive electrode 1 is made of the insoluble and infusible substrate, and the negative electrode 2 is formed of an alkali metal or its alloy. The second-type cell has either one of the following two doping mechanisms, i.e. cell operating mechanisms. One of them is a mechanism in which the doping of the insoluble and infusible substrate with the electron accepting dopant corresponds to charging and the undoping of it corresponds to discharging. For example, when the non-doped insoluble and infusible substrate and lithium are used and a propylene carbonate solution of $LiClO_4$ (1 mole/liter) is used as the electrolytic solution, the cell after building has an electromotive voltage of 2.5 to 3.0 V. When a voltage is applied to it from an external power supply to dope the insoluble and infusible substrate with $ClO_4^-$ ions, the electromotive voltage of the cell becomes 3.5 and 4.5 V.

The other is a mechanism in which the doping of the insoluble and infusible substrate with the electron donating dopant corresponds to discharging and its undoping corresponds to charging. For example, with the aforesaid cell construction, the electromotive voltage of the cell after building is 2.5 to 3.0 V. When the insoluble and infusible substrate is doped with lithium ions by discharging a current outside, the electromotive voltage becomes 1.0 to 2.5 V. When the lithium ions are removed by applying a voltage by an external power supply, the electromotive voltage again becomes 2.5 to 3.0 V.

The doping or undoping may be carried out at a constant current, or at a constant voltage or at varying currents and voltages. The amount of the dopant to dope the insoluble and infusible substrate is preferably 0.5 to 20% in terms of the percentage of the number of ions added per carbon atom of the substrate.

The cell including the insoluble and infusible substrate as an electrode is a secondary cell capable of being repeatedly charged and discharged. Its electromotive voltage varies with the structure of the cell.

With the first type, it is 1.0 to 3.5 V, and with the second type, it is 3.5 to 4.5 V (one having the first mechanism) and 2.5 to 3.0 V (one having the second mechanism).

The cell of this invention has a high energy density per unit weight, and if it is doped to a suitable extent, its energy density reaches 100 to 350 WH/kg. The power density of the cell of the invention is much higher than that of lead storage cells, although there is a difference depending upon the structure of the cell.

Furthermore, since the insoluble and infusible substrate of this invention is a very stable substance having excellent mechanical strength and flexibility, it scarcely undergoes fracture and the cell of this invention can be repeatedly charged and discharged and does not decrease in performance over an extended period of time.

The cell of this invention comprises an electrode active substance obtained by doping with the electron donating or accepting substance the insoluble and infusible substrate with a polyacene-type skeletal structure, which has superior oxidation resistance, heat resistance, moldability and mechanical strength to conventional known organic semiconductors, as an electrode, and a solution in the aprotic organic solvent of the compound capable of forming ions which can dope the electrode by electrolysis. It can be reduced in size, thickness and weight and has a high capacity, a high power and a long service life.

The following examples illustrate the present invention in greater detail.

EXAMPLE 1A

A solution prepared by mixing resol-type phenolic resin (as an aqueous solution in a concentration of about 65%), water and zinc chloride in a weight ratio of 10:3:12 was impregnated in a plain-weave cloth (a product of Japan Kaynol Co.) of phenolic fibers. The impregnated cloth was molded and cured under pressure for about 10 hours by a press-forming machine (adapted for making laminated structures; the same type of machine was usd in the subsequent examples) kept at 100° C. to obtain a composite plate-like article having a thickness of about 500 microns. In the resulting composite article, the weight ratio of the phenolic fibers to the phenolic resin was 0.15, and the weight ratio of zinc chloride to (the phenolic resin plus the phenolic fibers) was 1.6.

Separately, the aforesaid solution composed of the resol-type phenolic resin, water and zinc chloride was formed into a film by using an applicator, and cured at 100° C. for about 20 minutes to form a plate-like article having a thickness of 500 microns. In the plate-like article, the weight ratio of the phenolic fibers to the phenolic resin is 0, and the weight ratio of zinc chloride to (the phenolic resin plus the phenolic fibers) was 1.8.

The composite plate-like article and the plate-like article were each put in a siliconit electrical furnace, and heat-treated in an atmosphere of nitrogen to a temperature of 550° C. at a temperature elevating rate of about 40° C./hour. The resulting heat-treated articles were each washed with hot water at 100° C. for about 5 hours to remove the remaining zinc chloride. After washing, the articles were dried under reduced pressure at 60° C. for 3 hours to form plate-like articles as insoluble and infusible substrates. The plate-like substrate obtained from the composite article in accordance with this invention had excellent mechanical strength and was easy to handle. But the plate-like substrate obtained from the article prepared without using phenolic fibers had low strength and required caution in handling. The flexural strengths of these articles measured are shown in Table 1A.

X-ray fluorescent analysis of the insoluble and infusible substrate of this invention obtained from the composite article showed it to contain less than 0.01% by weight of Zn and less than 0.5% by weight of Cl based on the substrate. This led to the determination that scarcely any zinc chloride remained in the substrate. X-ray diffraction showed the existence of a main peak at $2\theta=20°-22°$, and a small peak at $2\theta=41°-46°$, and led to the determination that the substrate had a polyacene-type skeletal structure.

The insoluble and infusible substrates obtained from the composite article of the invention and the article not containing the phenolic fibes were subjected to elemental analysis and their electical conductivities and BET specific surface areas were measured. The results are summarized in Table 1A.

$LiAsF_6$ was dissolved in fully dehydrated propylene carbonate to form an about 1.0 mole/liter solution. Using lithium metal as a negative elecrode, the insoluble and infusible plate-like substrate as a positive electrode and the resulting solution as an electrolyte solution, a voltage of 4 V was applied across the two electrodes to dope with substrate with $AsF_6^-$ ions.

The amount of doping was expressed by the number of $AsF_6^-$ ions per carbon atom in the substrate. In the present invention, the number of $AsF_6^-$ ions was determined from the current flowing through the circuit during doping.

Thus, an electrically conductive organic polymeric material composed of the insoluble and infusible substrate doped with $AsF_6^-$ ions was obtained. After the doping, the material was taken out, washed with acetone, and dried under reduced pressure at 60° C. for 60 minutes. Then its electrical conductivity was measured. The results are shown in Table 1A.

TABLE 1A

| Sample | Flexural strength (kg/cm$^2$) | H/C atomic ratio | Specific surface area (m$^2$/g) | Electrical conductivity of the substrate (ohm$^{-1}$ cm$^{-1}$) | Amount of doping (%) | Electrical conductivity after doping (ohm$^{-1}$ cm$^{-1}$) |
|---|---|---|---|---|---|---|
| Invention | 50 | 0.22 | 1250 | $10^{-4}$ | 2.0 | $10^0$ |
| Comparison | 10 | 0.21 | 1200 | $10^{-4}$ | 2.0 | $10^0$ |

EXAMPLE 2A

A felt of phenolic fibers (a product of Japan Kaynol Co.) was heat-treated in an electrical furnace for about 6 hours at 200° C., 500° C. and 700° C. in an atmosphere of nitrogen to form three types of fibrous heat-treated product. Each of the fibrous heat-treated products was impregnated with a solution prepared by mixing a resol-type phenolic resin (as an aqueous solution in a concentration of about 65%), water and zinc chloride in a weight ratio of 10:3:20. The impregnated felt-like heat-treated product was molded and cured for about 10 minutes under pressure by using a press-forming machine heated at 100° C. to give a plate-like composite article. In the resulting composite article, the weight ratio of the fibrous heat-treated product to the phenolic resin was about 0.4, and the weight ratio of zinc chloride to (the fibrous heat-treated product plus the phenolic resin) was about 2.0. Then, under the same conditions as in Example 1A, the composite article was heat-treated, washed and dried to give an insoluble and infusible plate-like substrate.

The resulting samples were subjected to elemental analysis, and their electrical conductivities, specific surface areas and flexural strengths were measured. The reesults are shown in Table 2A.

The insoluble and infusible plate-like substrates were subjected to the same doping test as in Example 1A except that $LiClO_4$ was used instead of $LiAsF_6$. The results are summarized in Table 2A.

TABLE 2A

| Heat-treatment temperature (°C.) | H/C atomic ratio | Specific surface area ($m^2/g$) | Flexural strength ($kg/cm^2$) | Electrical conductivity of the substrate ($ohm^{-1} cm^{-1}$) | Amount of doping (%) | Electrical conductivity after doping ($ohm^{-1} cm^{-1}$) |
|---|---|---|---|---|---|---|
| 200 | 0.21 | 1600 | 80 | $10^{-4}$ | 1.9 | $10^0$ |
| 500 | 0.21 | 1400 | 90 | $10^{-4}$ | 1.9 | $10^0$ |
| 700 | 0.21 | 1000 | 90 | $10^{-4}$ | 1.8 | $10^0$ |

EXAMPLE 3A

Cut fibers (cut length about 2 mm) of phenolic fibers (diameter about 15 microns) were heat-treated at 300° C. for 4 hours in an atmosphere of nitrogen to form a fibrous heat-treated product. The heat-treated product was mixed with a solution prepared by mixing a resol-type phenolic resin (as an aqueous solution in a concentration of about 65%), water and zinc chloride in a weight ratio of 10:1:5. The mixed slurry was molded and cured for about 10 minutes under pressure by using a press-forming machine heated at about 100° C. to give a film-like composite article having a thickness of about 100 microns. In the film-like composite article, the weight ratio of the fibrous heat-treatd product to the phenolic resin was 0.06, and the weight ratio of zinc chloride to (the phenolic resin plus the fibrous heat-treated product) was 0.7.

The film-like composite article was heat-treated to a predetermined temperature in a siliconit electrical furnace, and then washed with hot water and dried in the same way as in Example 1A. In this way, film-like insoluble and infusible substrates having varying hydrogen/carbon atomic ratios were obtained. These substrates were subjected to elemental analysis, and their electrical conductivities, BET specific surface areas and flexural strengths were measured. The results are summarized in Table 3A.

Each of the films was put in a vacuum line, and the degree of vacuum was adjusted to below $10^{-2}$ torr. At room temperature iodine gas was introduced into the line and doped into the film for about 10 minutes. The electrical conductivities of the doped products are shown in Table 3A.

Iodine-doped film was taken out from the line and subjected to EPMA (electron probe X-ray microanalysis) to examine the state of distribution of iodine in a cross section of each sample, In all the samples tested, iodine was distributed uniformly from surface to interior.

TABLE 3A

| Heat-treatment temperature (°C.) | H/C atomic ratio | Specific surface area ($m^2/g$) | Flexural strength ($kg/cm^2$) | Electrical conductivity of the substrate ($ohm^{-1} cm^{-1}$) | Electrical conductivity after doping ($ohm^{-1} cm^{-1}$) |
|---|---|---|---|---|---|
| 450 | 0.45 | 800 | 35 | $10^{-10}$ | $10^{-4}$ |
| 500 | 0.30 | 820 | 35 | $10^{-5}$ | $10^{-1}$ |
| 650 | 0.15 | 720 | 35 | $10^{-3}$ | $10^0$ |
| 750 | 0.08 | 650 | 30 | $10^{-1}$ | $10^0$ |

EXAMPLE 4A

The substrate of this invention obtained in Example 1A having an H/C atomic ratio of 0.22 and a BET specific surface area of 1,250 $m^2/g$ was immersed in a tetrahydrofuran solution of sodium naphthalate prepared from dehydrated tetrahydrofuran, naphthalene and metallic sodium in a dry box (nitrogen atmosphere) in an attempt to dope sodium. After immersion for about 30 minutes, the substrate was washed with tetrahydrofuran and dried under reduced pressure at room temperature. The electrical conductivity of the doped sample was about $10^0$ $ohm^{-1}$-$cm^{-1}$ showing a marked increase over that of the undoped sample which was $10^{-4}$ $ohm^{-1}$-$cm^{-1}$. EPMA analysis showed that sodium was doped to the interior of the sample.

EXAMPLE 1B (1) A plain-weave cloth (a product of Japan Kaynol Co.) of phenolic fibers was impregnated with a solution prepared by mixing a resol-type phenolic resin (as an aqueous solution in a concentration of about 65%), water and zinc chloride in a weight ratio of 10:3:12, and then molded and cured under pressure for about 10 minutes by using a press-forming machine kept at 100° C. to give a plate-like composite article having a thickness of about 500 microns. In the resulting composite article, the weight ratio of the phenolic fibers to the phenolic resin was 0.15, and the weight ratio of zinc chloride to (the phenolic resin plus the phenolic fiberrs) was 1.6.

The aforesaid solution composed of the resol, water and zinc chloride was formed into a film by an applicator, and cured at 100° C. for about 20 minutes to form a plate-like article having a thickness of 500 microns. In the plate-like article, the weight ratio of the phenolic fibers to the phenolic resin was 0, and the weight ratio of zinc chloride to (the phenolic resin plus the phenolic fibers) was 1.8.

Each of the composite article and the article was put in a siliconit electrical furnace, and heat-treated in a nitrogen atmosphere to 550° C. at a temperature elevating rate of about 40° C./hour. The heat-treated products were each washed with hot water at 100° C. for about 5 hours to remove the remaining zinc chloride. After washing, they were each dried under reduced pressure at 60° C. for 3 hours to give insoluble and infusible plate-like substrates. The plate-like substrate obtained from the composite article of this invention had excellent mechanical strength and was easy to handle. But the plate-like substrate obtained from the article prepared without using the phenolic fibers had low strength and required caution in handling. The flexural strengths of these substrates were measured, and the results are shown in Table 1B.

X-ray fluorescent analysis of the insoluble and infusible substrate in accordance with this invention showed it to contain less than 0.01% by weight of Zn and less than 0.5% by weight of Zn based on the substrate. This led to the determination that scarcely any zinc chloride remained in the substrate. X-ray diffraction analysis showed the existence of a main peak at $2\theta = 20°-22°$, and a small peak at $2\theta = 41°-42°$, and led to the determination that the substrate had a polyacene-type skeletal structure.

The insoluble and infusible substrates were subjected to elemental analysis, and their BET specific surface areas were measured. The results are summarized in Table 1B.

(2) $LiAsF_6$ was dissolved in fully dehydrated propylene carbonate to form an about 1.0 mole/liter solution. An electric cell was built as shown in FIG. 1 using lithium metal as a negative electrode and the insoluble and infusible plate-like substrate as a positive electrode. A platinum mesh was used as a collector, and a felt of glass fibers, as a separator.

The cell in this example utilizes a first mechanism of the second type in this invention. In other words, doping of $AsF_6^-$ ions as an electron accepting dopant in the insoluble and infusible substrate corresponds to charging and undoping corresponds to discharging. The amount of doping can be expressed by the number of ions doped per carbon atom of the substrate. In the present invention, the number of ions doped was determined from the current flowing through the circuit during doping.

The voltage of the cell of the above structure immediately after building is shown in Table 1B. Then, a voltage was applied externally to the cell, and $AsF_6^-$ ions were doped in the insoluble and infusible substrate for 3.5 hours at a fixed current so that the amount of doping per hour became 1%. The open circuit voltage upon the termination of the doping is shown in Table 1B. Then, a fixed current was passed through the circuit so that the amount of undoping per hour became 1%, and the $AsF_6^-$ ions were undoped. The undoping was continued until the open circuit voltage became equal to the voltage of the cell immediately after building. The percentage of the amount of undoping to the amount of doping is shown in Table 1B as coulombic efficiency.

TABLE 1B

| Sample | Flexural strength (kg/cm$^2$) | H/C atomic ratio | Specific surface area (m$^2$/g) | Voltage immediately after building (V) | Voltage after doping (V) | Coulombic efficiency (%) |
|---|---|---|---|---|---|---|
| No. 1 (invention) | 50 | 0.22 | 1250 | 2.9 | 4.0 | 95 |
| No. 2 (comparison) | 10 | 0.21 | 1200 | 2.9 | 4.0 | 90 |

In Table 1B, the sample of the invention denotes the insoluble and infusible substrate obtained from the composite in accordance with this invention containing phenolic fibers or a cell built by using it, and the sample of comparison denotes the insoluble and infusible substrate obtained from the article prepared without using phenolic fibers or a cell built by using it.

It is seen from Table 1B that the insoluble and infusible substrate containing phenolic fibers had excellent mechanical strength, a job of building a secondary cell by using it is easy, and that the charging and discharging characteristics of the secondary cell so built are excellent.

EXAMPLE 2B

Cut fibers (cut length about 2 mm) of phenolic fibers (fiber diameter about 15 microns) were added to a solution prepared by mixing a resol-type phenolic resin (as an aqueous solution in a concentration of about 65%), water and zinc chloride in a weight ratio of 10:1:5, and they were fully mixed. The resulting slurry was molded and cured under pressure for about 10 minutes by using a press forming machine heated at about 100° C. to obtain a film-like composite article having a thickness of about 100 microns. In the film-like composite article, the weight ratio of the phenolic resins to the phenolic resin was 0.08, and the weight ratio of zinc chloride to (the phenolic resin plus the phenolic fibers) was 0.7. The film-like composite article was heat-treated to a predetermined temperature in a siliconit electrical furnace. The heat-treated article was washed with hot water and dried in the same way as in Example 1B. Thus, film-like insoluble and infusible substrates having varying H/C atomic ratios were obtained. These substrates were subjected to elemental analysis, and their BET specific surface areas and flexural strengths were measured. The results are summarized in Table 2B.

Cells were built in the same way as in Example 1B, and their charging and discharging characteristics were examined except that $LiBF_4$ was used instead of $LiAsF_6$. The results are summarized in Table 2B.

TABLE 2B

| Sample No. | Heat-treatment temperature (°C.) | H/C atomic ratio | Specific surface area (m²/g) | Flexural strength (kg/cm²) | Voltage after doping (V) | Coulombic efficiency (%) |
| --- | --- | --- | --- | --- | --- | --- |
| 1 | 450 | 0.45 | 810 | 25 | 3.9 | 85 |
| 2 | 500 | 0.30 | 850 | — | 4.0 | 90 |
| 3 | 620 | 0.16 | 770 | — | 4.1 | 90 |
| 4 | 740 | 0.08 | 680 | 35 | 4.2 | 80 |

The building of the cells was easy because the mechanical strengths of the of the insoluble and infusible substrates used as electrodes were excellent. Since no breakage occurred in the electrodes during charging and discharging, the resulting secondary cells were stable and had high performance.

EXAMPLE 3B

A resol-type phenolic resin (as an aqueous solution in a concentration of about 65%), water and zinc chloride were mixed in a predetermined weight ratio to form a solution. A felt (a product of Japan Kaynol Co.) of phenolic fibers were impregnated with the solution, and then molded and cured for about 15 minutes under a pre-determined pressure by using a press forming machine heated at 100° C. In this way, plate-like composite articles were produced.

In the composite articles, the weight ratio of the felt of phenolic fibers to the phenolic resin was in the range of 0.2 to 1.0, and the weight ratio of zinc chloride to (the felt of phenolic fibers plus the phenolic resin) was in the range of 1.5 to 4. The composite articles were each heat-treated, washed and dried under the same as in Example 1B to obtain insoluble and infusible plate-like substrates.

The substrates were subjected to elemental analysis, and their BET specific surface areas and flexural strengths were measured. The results are shown in Table 3B.

Cells were built by using the plate-like substrates, and subjected to a charging and discharging test, in the same way as in Example 1B except that LiClO₄ was used instead of LiAsF₆. The results are summarized in Table 3B.

TABLE 3B

| Sample No. | Ratio of the felt of phenolic fibers to the phenolic resin | H/C atomic ratio | Specific surface area (m²/g) | Flexural strength (kg/cm²) | Voltage after doping (V) | Coulombic efficiency (%) |
| --- | --- | --- | --- | --- | --- | --- |
| 1 | 0.2 | 0.22 | 1300 | 60 | 3.9 | 90 |
| 2 | 0.6 | 0.23 | 1350 | 80 | 4.0 | 90 |
| 3 | 1.0 | 0.24 | 1350 | 120 | 3.9 | 95 |

The secondary cells having the insoluble and infusible substrates including phenolic fibers as electrodes showed excellent charging and discharging characteristics. As the amount of the phenolic fibers increased, the strength of the substrate became very high.

EXAMPLE 4B

This example pertains to a cell of the first type in this invention, namely a secondary cell including an insoluble and infusible substrate as a positive and a negative electrode.

A cell was constructed by using the insoluble and infusible plate-like substrates as a positive and a negative electrode, and a 1 mole/liter propylene carbonate solution of LiClO₄ as an electrolyte solution, and subjected to a charging and discharging test.

Immediately after building, the cell had an open circuit voltage of 0 V. Then, a voltage was applied from an external power supply to charge the cell by doping $ClO_4^-$ ions in the positive electrode and $Li^+$ ions in the negative electrode. The charging speed was adjusted such that the amount of doping per hour became 1%, and the charging was carried out for about 3 hours. After charging, the cell had an open circuit voltage of 2.3 V. Then, the cell was discharged by undoping $ClO_4^-$ ions and $Li^+$ ions at the same speed as in the charging. The discharging was carried out until the open circuit voltage of the cell became 0 V. The coulombic efficiency was about 80%.

EXAMPLE 1C

A plain-weave cloth (a product of Japan Kaynol) of phenolic fibers was heat-treated at 300° C. for 4 hours in an electrical furnace in an atmosphere of nitrogen to obtain a fibrous heat-treated product. The fibrous heat-treated product was impregnated with a solution prepared by mixing a resol-type phenolic resin (as an aqueous solution in a concentration of about 65%), water and zinc chloride in a weight ratio of 10:5:26, and then molded and cured under pressure for about 10 minutes by using a press-forming machine heated at 100° C. to obtain a plate-like composite article having a thickness of 500 microns. In the resulting composite article, the weight ratio of the fibrous heat-treated product to the phenolic resin was 0.11, and the weight ratio of zinc chloride to (the phenollic resin plus the fibrous heat-treated product) was 3.6.

The above solution composed of the resol, water and zinc chloride was formed into a film by means of an applicator. The film was cured at 100° C. for about 20 minutes to give a plate-like molded article having a thickness of 500 microns. In the resulting plate-like article, the weight ratio of the fibrous heat-treated product to the phenolic resin was 0, and the weight ratio of zinc chloride to (the fibrous heat-treated product plus the phenolic fibers) was 4.0.

The molded articles were each put in a siliconit elecrical furnace and heat-treated to 550° C. at a temperature elevating rate of about 40° C./hour in an atmosphere of nitrogen. The heat-treated products were each washed with hot water at 100° C. for about 5 hours to remove the remaining zinc chloride, and then dried under reduced pressure to give insoluble and infusible plate-like substrates.

The plate-like substrate obtained from the composite article containing the phenolic fibers had excellent mechanical strength and was easy to handle. The plate-like substrate obtained from the article not containing the phenolic fibers had low strength and required caution in handling. The flexural strengths of these substrates were measured, and the results are shown in Table 1C.

X-ray fluorescent analysis of the insoluble and infusible substrate in accordance with this invention showed it to contain less than 0.01% by weight of Zn and less than 0.5% by weight of Zn based on the substrate. This led to the determination that scarcely any zinc chloride remained in the substrate. X-ray diffraction analysis showed the existence of a main peak at $2\theta=20°-22°$, and a small peak at $2\theta=41°-46°$, and led to the determination that the substrate had a polyacene-type skeletal structure.

The insoluble and infusible substrates were subjected to elemental analysis, and their BET specific surface areas were measured. The results are summarized in Table 1C.

LiAsF$_6$ was dissolved in fully dehydrated propylene carbonate to form an about 1.0 mole/liter solution. An electric cell was built as shown in FIG. 1 using lithium metal as a negative electrode and the insoluble and infusible plate-like substrate as a positive electrode. A platinum mesh was used as a collector, and a felt of glass fibers, as a separator.

The cell in this example utilizes a first mechanism of the second type in this invention. In other words, doping of AsF$_6^-$ ions as an electron accepting dopant in the insoluble and infusible substrate corresponds to charging and undoping corresponds to discharging. The amount of doping can be expressed by the number of ions doped per carbon atom of the substrate. In the present invention, the number of ions doped was determined from the current flowing through the circuit during doping.

The volatage of the cell of the above structure immediately after building is shown in Table 1C. Then, a voltage was applied externally to the cell, and AsF$_6^-$ ions were doped in the insoluble and infusible substrate for 3.5 hours at a fixed current so that the amount of doping per hour became 1%. The open circuit voltage upon the termination of the doping is shown in Table 1C. Then, a fixed current was passed through the circuit so that the amount of undoping per hour became 1%, and the AsF$_6^-$ ions were undoped. The undoping was continued until the open circuit voltage became equal to the voltage of the cell immediately after building. The percentage of the amount of undoping to the amount of doping is shown in Table 1C as coulombic efficiency.

In Table 1C, the sample of the invention denotes the insoluble and infusible substrate obtained from the composite article in accordance with this invention containing phenolic fibers or a cell built by using it, and the sample of comparison denotes the insoluble and infusible substrate obtained from the article prepared without using phenolic fibers or a cell built by using it.

It is seen from Table 1C that the insoluble and infusible substrate containing phenolic fibers had excellent mechanical strength, a job of building a secondary cell by using it is easy, and that the charging and discharging characteristics of the secondary cell so built are excellent.

TABLE 1C

| Sample | Flexural strength (kg/cm$^2$) | H/C atomic ratio | Specific surface area (m$^2$/g) | Voltage immediately after building (V) | Voltage after doping (V) | Coulombic efficiency (%) |
|---|---|---|---|---|---|---|
| No. 1 (invention) | 60 | 0.21 | 1600 | 2.9 | 4.0 | 94 |
| No. 2 (comparison) | 10 | 0.20 | 1700 | 2.9 | 4.0 | 92 |

EXAMPLE 2C

A felt (a product of Japan Kaynol Co.) of phenolic fibers was heat-treated in an electrical furnace at 100° C. for 6 hours in an atmosphere of nitrogen to obtain a fibrous heat-treated product. The above procedure was repeated at heat-treatment temperatures of 200, 500 and 700° C. Separately, the same felt as above was heat-treated at 200° C. for 1 hour in an oxidizing atmosphere by a hot air dryer to obtain a fibrous heat-treated product.

The five fibrous heat-treated products so obtained were each impregnated with a solution prepared by mixing a resol-type phenolic resin (as an aqueous solution in a concentration of about 65 %), water and zinc chloride in a weight ratio of 10:3:20, and molded and cured under pressure for about 10 minutes by using a press-forming machine heated at 100° C. to produce composite plate-like articles. In the resulting composite articles, the weight ratio of the fibrous heat-treated product to the phenolic resin was about 0.4, and the weight ratio of zinc chloride to (the fibrous heat-treated product plus the phenolic resin) was about 2.0

The composite plate-like articles were each heat-treated, washed and dried under the same conditions as in Example 1C to form insoluble and infusible plate-like substrates.

Cracks formed during the heat treatment in the insoluble and infusible substrate prepared by using the fibrous heat-treated product obtained by heat-treatment at 100° C. in the electrical furnace in an atmosphere of nitrogen, but no cracking occurred in the other substrates.

These substrates were subjected to elemental analysis, and their BET specific surface areas and flexural strengths were also measured. The results are shown in Table 2C.

Cells were built by using the insoluble and infusible plate-like substrates in the same way as in Example 1C except that LiClO$_4$ was used instead of LiAsF$_6$, and subjected to a charging and discharging test. The results are summarized in Table 2C.

TABLE 2C

| Sample No. | Conditions for preparing the heat-treated fibrous article | | | H/C atomic ratio | Specific surface area (m²/g) | Flexural strength (kg/cm²) | Voltage after doping (V) | Coulombic efficiency (%) |
|---|---|---|---|---|---|---|---|---|
| | Atmosphere | Temperature (°C.) | Time (hours) | | | | | |
| 1 | Nitrogen | 100 | 6 | 0.21 | 1650 | 80 | 4.1 | 95 |
| 2 | " | 200 | 6 | 0.21 | 1600 | 80 | 4.0 | 95 |
| 3 | " | 500 | 6 | 0.21 | 1400 | 90 | 4.0 | 90 |
| 4 | " | 700 | 6 | 0.21 | 1000 | 90 | 4.0 | 90 |
| 5 | Oxidizing atmosphere | 200 | 1 | 0.21 | 1600 | 80 | 4.0 | 95 |

EXAMPLE 3C

Cut fibers (cut length about 2 mm) of phenolic fibers (diameter about 15 microns) were heat-treated at 300° C. for 4 hours in an atmosphere of nitrogen to form a fibrous heat-treated product. The heat-treated product was mixed with a solution prepared by mixing a resol-type phenolic resin (as an aqueous solution in a concentration of about 65%), water and zinc chloride in a weight ratio of 10:1:5. The mixed slurry was molded and cured for about 10 minutes under pressure by using a press-forming machine heated at about 100° C. to give a film-like composite article having a thickness of about 100 microns. In the film-like composite article, the weight ratio of the fibrous heat-treated product to the phenolic resin was 0.06, and the weight ratio of zinc chloride to (the phenolic resin plus the fibrous heat-treated product) was 0.7.

The film-like composite article was heat-treated to predetermined temperatures in a siliconit electrical furnace, and then washed with hot water and dried in the same way as in Example 1C to give film-like insoluble and infusible substrates having varying hydrogen/carbon atomic ratios. These substrates were subjected to elemental analysis, and their BET specific surface areas and flexural strengths were measured. The results are summarized in Table 3A. Furthermore, electrical cells were built, and their charging and discharging characteristics were measured, in the same way as in Example 1C except that LiBF₄ was used instead of LiAsF₆. The results are summarized in Table 3C.

TABLE 3C

| Sample No. | Heat-treatment temperature (°C.) | H/C atomic ratio | Specific surface area (m²/g) | Flexural strength (kg/cm²) | Voltage after doping (V) | Coulombic efficiency (%) |
|---|---|---|---|---|---|---|
| 1 | 450 | 0.45 | 800 | 35 | 3.9 | 88 |
| 2 | 500 | 0.30 | 820 | 35 | 4.0 | 90 |
| 3 | 650 | 0.15 | 720 | 35 | 4.1 | 85 |
| 4 | 750 | 0.08 | 650 | 30 | 4.2 | 78 |

In all cases, the building of the cell was easy because the insoluble and infusible substrate used as an electrode had excellent mechanical strength. Furthermore, since no breakage occurred in the electrode during charging and discharging, the resulting secondary cell was stable and had high performance.

EXAMPLE 4C

This example pertains to a cell of the first type in this invention, namely a secondary cell including an insoluble and infusible substrate as a positive and a negative elecrode.

A cell was constructed by using the insoluble and infusible plate-like substrate identified as No. 1 in Example 1C as a positive and a negative electrode, and a 1 mole/liter propylene carbonate solution of LiClO₄ as an electrolyte solution, and subjected to a charging and discharging test.

Immediately after building, the cell had an open circuit voltage of 0 V. Then, a voltage was applied from an external power supply to charge the cell by doping ClO₄⁻ ions in the positive electrode and Li⁻ ions in the negative electrode. The charging speed was adjusted such that the amount of doping per hour became 1%, and the charging was carried out for about 2 hours. After charging, the cell had an open circuit voltage of 1.7 V. Then, the cell was discharged by undoping ClO₄⁻ ions and Li⁺ ions at the same speed as in the charging. After 1.5 hours, the open circuit voltage was 0 V.

EXAMPLE 1D

A plain-weave cloth (a product of Japan Kaynol Co.) of phenolic carbon fibers was impregnated with a solution prepared by mixing a resol-type phenolic resin (as an aqueous solution in a concentration of about 65%), water and zinc chloride in a weight ratio of 10:3:12, and molded and cured under pressure for about 10 minutes by using a press-forming machine heated at 100° C. to form a composite plate-like article having a thickness of about 500 microns. In the resulting composite article, the weight ratio of the phenolic carbon fibers to the phenolic resin was 0.12, and the weight ratio of zinc chloride to (the phenolic carbon fibers plus the phenolic resin) was 1.5.

The above solution composed of the resol, water and zinc chloride was formed into a film by an applicator, and cured at 100° C. for about 20 minutes to form a plate-like article having a thickness of 500 microns. In the plate-like article, the weight ratio of the phenolic carbon fibers to the phenolic resin was 0, and the weight ratio of zinc chloride to (the phenolic carbon fibers plus the phenolic resin) was 1.8.

The composite article and the film-like article were each put in a siliconit electrical furnace, and heat-treated in an atmosphere of nitrogen to 550° C. at a temperature elevating rate of about 40° C./hour. The heat-treated products were washed with hot water at 100° C. for about 5 hours to remove the remaining zinc chloride. After washing, the heat-treated products were dried under reduced pressure at 60° C. for 3 hours to form insoluble and infusible plate-like substrates. The plate-like substrate obtained from the composite article in accordance with this invention had flexibility and excellent mechanical strength and was easy to handle. The plate-like substrate obtained from the article not including the phenolic carbon fibers had low strength and required caution in handling. The flexural strengths of these substrates were measured, and the results are shown in Table 1D.

X-ray fluorescent analysis of the insoluble and infusible substrate of this invention showed it to contain less than 0.01% by weight of Zn and less than 0.5% by weight of Cl, based on the substrate, and led to the determination and scarcely any zinc chloride remained in the substrate.

The substrates were subjected to elemental analysis, and their BET specific surface areas were measured. The results are summarized in Table 1D.

Cells were constructed as shown in FIG. 1 by using lithium metal as a negative electrode, the insoluble and infusible plate-like substrates as a positive electrode, and an about 1.0 mole/liter solution obtained by dissolving $LiAsF_6$ in fully dehydrated propylene carbonate. A platinum mesh was used as a collector, and a felt of glass fibers, as a separator.

THe cells in this example utilize a first mechanism of the second type. In other words, doping of $AsF_6^-$ ions as an electron accepting dopant in the insoluble and infusible substrates corresponds to charging, and undoping, to discharging. The amount of doping is expressed by the number of ions doped per carbon atom in the substrate. The number of ions doped in this invention determined from the current flowing through the circuit during doping.

The voltages of the cells immediately after building is shown in Table 4D. A voltage was applied externally to the cells, and $AsF_6^-$ ions were doped into the insoluble and infusible substrates for 3.5 hours at a fixed current so that the amount of doping per hour became 1%. The open circuit voltages upon termination of doping are shown in Table 1D.

Then, the $AsF_6^-$ ions were undoped by passing a fixed current through the circuit so that the amount of undoping per hour became 1%. The undoping was continued until the open circuit voltage of each cell became equal to its voltage immediately after building. The percentage of the amount of undoping based on the amount of doping is shown in Table 1D as coulombic efficiency.

TABLE 1D

| Sample | Flexural strength (kg/cm²) | H/C atomic ratio | Specific surface area (m²/g) | Voltage immediately after building (V) | Voltage after doping (V) | Coulombic efficiency (%) |
|---|---|---|---|---|---|---|
| No. 1 (invention) | above 50 | 0.20 | 1050 | 2.9 | 4.0 | 95 |
| No. 2 (comparison) | 10 | 0.22 | 1200 | 2.9 | 4.0 | 90 |

In Table 1D, the sample of the invention denotes the insoluble and infusible substrate obtained from the composite article in accordance with this invention containing the phenolic carbon fibers or a cell built by using it, and the sample of comparison denotes the insoluble and infusible substrate obtained from the article prepared without using the phenolic carbon fibers or a cell built by using it.

It is seen from Table 1D that the insoluble and infusible substrate containing the phenolic carbon fibers had excellent mechanical strength, a job of building a secondary cell by using it is easy, and that the charging and discharging characteristics of the secondary cell so built are excellent. In Table 4D, the flexural strength of the sample of the invention is shown to be above 50. This is because no clear fracture occurred owing to the flexibility of the sample.

EXAMPLE 2D

Cut fibers (cut length about 2 mm) of acrylic carbon fibers (diameter about 15 microns) were fully mixed with a solution prepared by mixing a resol-type phenolic resin (as an aqueous solution in a concentration of about 65%), water and zinc chloride in a weight ratio of 10:1:5. The resulting slurry was molded and cured for about 10 minutes under pressure by a press-forming machine heated at about 100° C. to give a composite film-like article having a thickness of about 100 microns. In the resulting composite film-like article, the weight ratio of the acrylic carbon fibers to the phenolic resin was 0.08, and the weight of zinc chloride to (the phenolic resin plus the acrylic carbon fibers) was 0.8. The composite film-like article was then heat-treated to a predetermined temperature in a siliconit electrical furnace, and then washed with hot water and dried in the same way as in Example 1D. In this way, insoluble and infusible film-like substrates having various H/C atomic ratios were obtained. These substrate were subjected to elemental analysis, and their BET specific surface areas snd flexural strengths were measured. The results are shown in Table 2D. The results are summarized in Table 2D.

Electric cells were built in the same way as in Example 1D using the resulting substrates except that $LiBF_4$ was used instead of $LiAsF_6$. The results are summarized in Table 2D.

TABLE 2D

| Sample No. | Heat-treatment temperature (°C.) | H/C atomic ratio | Specific surface area (m²/g) | Flexural strength (kg/cm²) | Voltage after doping (V) | Coulombic efficiency (%) |
|---|---|---|---|---|---|---|
| 1 | 450 | 0.48 | 780 | above 20 | 3.9 | 85 |
| 2 | 500 | 0.28 | 820 | — | 4.0 | 90 |
| 3 | 620 | 0.15 | 760 | — | 4.0 | 90 |
| 4 | 740 | 0.08 | 650 | above 30 | 4.1 | 80 |

In all runs, it was easy to build a cell because the insoluble and infusible substrate had excellent mechanical strength. In addition, since no breakage of the elecrode occurred during charging and discharging, a secondary cell which was stable and had high performance was obtained.

EXAMPLE 3D

A felt (a product of Japan Kaynol) of phenolic carbon fibers was impregnated with a solution prepared by mixing a resol-type phenolic resin (as an aqueous solution in a concentration of about 65%), water and zinc chloride in a predetermined weight ratio, and then molded and cured for about 15 minutes under a predetermined pressure by a press-forming machine heated at 100° C. In this way, composite plate-like articles were prepared.

In these composite articles, the weight ratio of the phenolic carbon fibers to the phenolic resin was in the range of 0.2 to 1.0, and the weight ratio of zinc chloride to (the phenolic carbon fibers plus the phenolic resin) was in the range of 1.5 to 4.5.

Then, the composite articles were each heat-treated, washed and dried under the same conditions as in Example 1D to form insoluble and infusible plate-like substrates. The substrates were subjected to elemental analysis, and their BET specific surface areas and flexural strengths were measured. The results are shown in Table 3D.

Cells were built in the same way as in Example 1D using the resulting insoluble and infusible plate-like substrates, and subjected to a charging and discharging test, in the same way as in Example 1D except that LiClO$_4$ was used instead of LiAsF$_6$.

The results are summaried in Table 3D.

TABLE 3D

| Sample No. | Ratio of carbon fibers to phenolic resin | H/C atomic ratio | Specific surface area (m$^2$/g) | Flexural strength (kg/cm$^2$) | Voltage after doping (V) | Coulombic efficiency (%) |
|---|---|---|---|---|---|---|
| 1 | 0.2 | 0.20 | 1200 | above 50 | 3.9 | 90 |
| 2 | 0.5 | 0.18 | 1200 | above 70 | 4.0 | 95 |
| 3 | 1.0 | 0.15 | 850 | above 80 | 4.0 | 90 |

EXAMPLE 4D

This example pertains to a cell of the first type in this invention, namely a secondary cell including an insoluble and infusible substrate as a positive and a negative elecrode.

A cell was constructed by using the same insoluble and infusible plate-like substrate as used in Example 3D, No. 1 as a positive and a negative electrode, and a 1 mole/liter propylene carbonate solution of LiClO$_4$ as an electrolyte solution, and subjected to a charging and discharging test.

Immediately after building, the cell had an open circuit voltage of 0 V. Then, a voltage was applied from an external power supply to charge the cell by doping ClO$_4^-$ ions in the positive electrode and Li$^+$ ions in the negative electrode. The charging speed was adjusted such that the amount of doping per hour became 1%, and the charging was carried out for about 3 hours. After charging, the cell had an open circuit voltage of 2.4 V. Then, the cell was discharged by undoping ClO$_4^-$ ions and Li$^+$ ions at nearly the same speed as in the charging. The discharging was carried out until the open circuit voltage of the cell became 0 V. The coulombic efficiency was about 80%.

What is claimed is:

1. An insoluble and infusible substrate with a polyacene-type skeletal structure having a hydrogen/carbon atomic ratio of from 0.05 to 0.60 and a specific surface area, measured by the BET method, of at least 600 m$^2$/9, said substrate being a heat-treated product of a mixture comprising an aromatic condensation polymer consisting of carbon, hydrogen and oxygen as a matrix and a fiber component selected from the group consisting of phenol resin fibers and carbon fibers dispersed in said matrix.

2. The substrate of claim 1 wherein the aromatic condensation polymer is a condensation product of an aromatic hydrocarbon compound having a phenolic hydroxyl group and an aldehyde.

3. The substrate of claim 1 wherein the aromatic condensation polymer is a condensation product of phenol and formaldehyde.

4. The substrate of claim 1 wherein the phenol resin fibers are made of a condensation product of phenol and formaldehyde.

5. The substrate of claim 1 wherein the phenol resin fibers are the product of heat-treatment of phenol resin fibers at a temperature of 150 to 800° C.

6. The substrate of claim 1 wherein the polyacene skeletal structure has a hydrogen/carbon atomic ratio of from 0.05 to 0.5.

7. The substrate of claim 1 wherein the polyacene-skeletal structure has a hydrogen/carbon atomic ratio of from 0.15 to 0.60.

8. The substrate of claim 1 wherein the amount of the fiber component is in the range of 5 to 75% by weight based on the total weight of the aromatic condensation polymer and the fiber component.

9. An electrically conductive organic polymeric material comprising
(a) an insoluble and infusible substrate with a polyacene skeletal structure having a hydrogen/carbon atomic ratio of from 0.05 to 0.60 and a specific surface area, measured by the BET method, of at least 600 m$^2$/g, said substrate being a heat-treated product of a mixture comprising an aromatic condensation polymer consisting of carbon, hydrogen and oxygen as a matrix and a fiber component selected from the group consisting of phenol resin fibers, and carbon fibers dispersed in said matrix, and
(b) an electron donating doping agent, or an electron accepting doping agent, or both;
said material having a higher electrical conductivity than the non-doped substrate (a).

10. The material of claim 9 wherein the aromatic condensation polymer is a condensation product of an aromatic hydrocarbon compound having a phenolic hydroxyl group and an aldehyde.

11. The material of claim 9 wherein the aromatic condensation polymer is a condensation product of phenol and formaldehyde.

12. The material of claim 9 wherein the phenol resin fibers are made of a condensation product of phenol and formaldehyde.

13. The material of claim 9 wherein the heat-treated phenol resin fibers is the product of heat-treatment of phenol resin fibers at a temperature in the range of 150° to 800° C.

14. The material of claim 9 wherein the polyacene skeletal structure has a hydrogen/carbon atomic ratio of from 0.15 to 0.60.

15. The material of claim 9 wherein the polyacene skeletal structure has a hydrogen/carbon atomic ratio of from 0.25 to 0.50.

16. The material of claim 9 wherein the amount of the fiber component is in the range of 5 to 75% by weight based on the total weight of the aromatic condensation polymer and the fiber component.

17. The material of claim 9 which has a direct-current electric conductivity at room temperature of at least $10^{-4}$ ohm$^{-1}$ cm$^{-1}$.

18. The material of claim 9 wherein the electron donating doping agent is a metal of Group IA of the periodic table selected from the group consisting of lithium, sodium, potassium, rubidium and cesium.

19. The material of claim 9 wherein the electron accepting doping agent is a halogen selected from the group consisting of fluorine, chlorine, bromine and iodine.

20. The material of claim 9 wherein the electron accepting doping agent is a halogen compound selected from the group consisting of $AsF_5$, $PF_5$, $BF_3$, $BCl_3$ and $BBr_3$.

21. The material of claim 9 wherein the electron accepting doping agent is an oxide of a non-metal element or an anion derived from an inorganic acid.

22. The material of claim 9 which is in the form of a molded article.

23. The material of claim 9 which is in the form of a film or plate.

24. An organic cell comprising a positive electrode, a negative electrode and an electrolytic solution, one or both of said positive and negative electrodes being composed of an insoluble and infusible substrate with a polyacene skeletal structure having a hydrogen/carbon atomic ratio of from 0.05 to 0.60 and a specific surface area, measured by the BET method, of at least 600 $m^2/g$, said substrate being a heat-treated product of a mixture comprising an aromatic condensation polymer consisting of carbon, hydrogen and oxygen as a matrix and a fiber component selected from the group consisting of phenol resin fibers and carbon fibers dispersed in said matrix, and said electrolytic solution being a solution in an aprotic organic solvent of a compound capable of forming ions which can dope said electrodes by electrolysis.

25. The organic cell of claim 24 wherein the aromatic condensation polymer is a condensation product of an aromatic hydrocarbon compound having a phenolic hydroxyl group and an aldehyde.

26. The organic cell of claim 24 wherein the aromatic condensation polymer is a condensation product of phenol and formaldehyde.

27. The organic cell of claim 24 wherein the phenol resin fibers are made of a condensation product of phenol and formaldehyde.

28. The organic cell of claim 24 wherein the phenol resin fibers are the product of heat-treatment of phenol resin fibers at a temperature in the range of 150° to 800° C.

29. The organic cell of claim 24 wherein the hydrogen/carbon atomic ratio of the substrate is from 0.05 to 0.50.

30. The organic cell of claim 24 wherein the hydrogen/carbon atomic ratio of the substrate is from 0.1 to 0.35.

31. The organic cell of claim 24 wherein the positive electrode is composed of the insoluble and infusible substrate and the negative electrode is composed of an alkali metal or an alkaline earth metal.

32. The organic cell of claim 31 wherein the negative electrode is composed of the alkali metal.

33. The organic cell of claim 32 wherein the alkali metal is lithium.

34. The organic cell of claim 24 wherein the compound capable of forming dopable ions is LiI, NaI, $NH_4I$, $LiClO_4$, $LiAsF_6$, $LiBF_4$, $KPF_6$, $NaPF_6$, $(C_2H_5)_4NClO_4$, $(C_2H_5)_4NBF_4$, $(n-C_4H_9)_4NClO_4$, $(n-C_4H_9)_4HAsF_6$, $(n-C_4H_9)_4NPF_6$ or $LiHF_2$.

35. The organic cell of claim 24 whereint the aprotic organic solvent is ethylene carbonate, propylene carbonate, gamma-butyrolactone, dimethylformamide, dimethylacetamide, dimethyl sulfoxide, sulfolane, acetonitrile, dimethoxyethane, tetrahydrofuran or methylene chloride.

36. The organic cell of claim 24 wherein the aprotic organic solvent is propylene carbonate, gamma-butyrolactone, sulfolane or dimethoxyethane.

37. The organic cell of claim 24 wherein the insoluble and infusible substrate is in the form of a film, sheet or plate.

* * * * *